United States Patent [19]
Kobayashi et al.

[11] Patent Number: 4,735,881
[45] Date of Patent: Apr. 5, 1988

[54] METHOD FOR FORMING PATTERNS BY USING A HIGH-CURRENT-DENSITY ELECTRON BEAM

[75] Inventors: Koichi Kobayashi; Hiroshi Yasuda, both of Yokohama, Japan

[73] Assignee: Fujitsu Limited, Kawasaki, Japan

[21] Appl. No.: 883,386

[22] Filed: Jul. 8, 1986

[30] Foreign Application Priority Data

Jul. 9, 1985 [JP] Japan ................................ 60-150473

[51] Int. Cl.$^4$ .............................................. G03C 5/00
[52] U.S. Cl. ...................................... 430/30; 430/296; 430/311; 430/942; 250/492.2; 250/492.3
[58] Field of Search ...................... 430/30, , 296, 311, 430/394, 494, 942, 22; 250/492.2, 492.3, 492.22

[56] References Cited

U.S. PATENT DOCUMENTS 4,295,048 10/1981 Cleland et al. .................. 250/398
4,591,540 5/1986 Bohlen et al. .................. 430/22

OTHER PUBLICATIONS

Thompson et al., Introduction to Microlithography, American Chemical Society, Washington DC, 1983.

Primary Examiner—John E. Kittle
Assistant Examiner—José G. Dees
Attorney, Agent, or Firm—Staas & Halsey

[57] ABSTRACT

A method incorporated in a high throughput EB lithography suitable to the fabrication of VLSI semiconductor circuit. The method comprises a step of providing patterns which are delineated to join together with an overlap determined in accordance with the time interval between the respective delineations thereof by using an electron beam having a high current density and/or high energy. When a first and a second patterns having respective edge portions contacting with each other are delineated in the order of the first pattern and the second pattern by respective exposures thereof to corresponding at least single shots of an electron beam, at least one of the first and second patterns is extended in the direction perpendicular to the edge portions so that the patterns are provided with an overlap with the amount determined in accordance with the time interval between the respective shots of the electron beam to said edge portions.

13 Claims, 4 Drawing Sheets

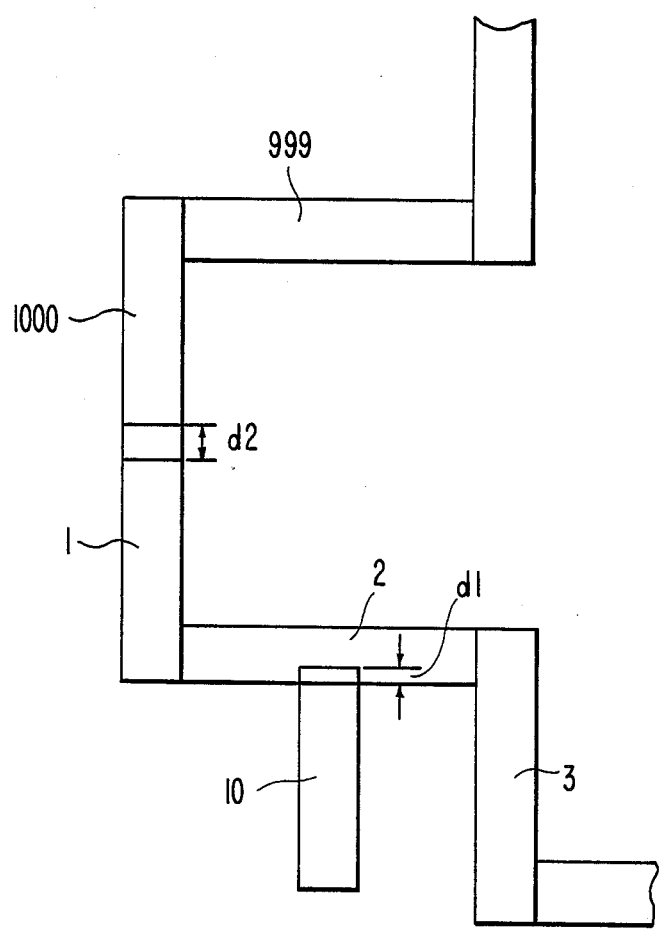

METHOD FOR FORMING PATTERNS BY USING A HIGH-CURRENT-DENSITY ELECTRON BEAM

BACKGROUND OF THE INVENTION

The present invention relates to an electron beam lithography, and more particularly, to an improvement in the accuracy of the connecting portion of patterns joining together, which are delineated by using a high current density electron beam such as that employed in a high throughput electron beam lithography.

High throughput electron beam (EB) lithography is becoming indispensable to facilitate quick turnaround in the fabrication of a variety of VLSI (very large scale integration) semiconductor circuits. In such high throughput EB lithography for VLSI circuits a relatively high current density and high energy electron beam is used. For instance, the current and acceleration energy of an electron beam employed in high throughput EB lithography are greater than 1 microampere (uA) and 20–80KeV, respectively, which are relatively larger than the current of few to hundreds of nanoamperes (nA) and the acceleration energy of 20KeV or less in a conventional EB lithography.

On the other hand, there occurs a problem relating to a faulty connection of patterns which are formed to join together through the respective predetermined edge portions thereof, when the patterns are delineated by using a high throughput EB lithography. Such faulty connection is generally caused by the narrowing in the pattern width occurring in the vicinity of the respective edge portions of the patterns to be joined. The narrowing would not only decrease the accuracy of a composite pattern formed from the joined patterns but also result in the disconnection inherent in the composite pattern. If the composite pattern constitutes an interconnecting wiring line, such faulty connection would produce a wiring of an insufficient current capacity or an open-circuited interconnection.

According to a study on the faulty connection between the patterns delineated by a high throughput EB lithography, it is revealed that the above-mentioned narrowing in the width of a pattern is caused in association with the temperature dependency of the sensitivity of the resist material layer involved therein and is enhanced with the increase in the time interval between the formation of the patterns to be joined together. Accordingly, it is requested to provide a method of an EB exposure for forming patterns regardless of the temperature dependency of the resist material and of the influence of such time interval, while the development of an electron beam sensitive resist material having a sensitivity characteristic with less temperature dependency is going to be undertaken.

SUMMARY OF THE INVENTION

It is, therefore, an object of the present invention to provide a method for improving the accuracy of the connecting portion of patterns joining together even when the patterns are delineated by using a high current density and/or high energy electron beam.

It is another object of the present invention to provide a method which allows to delineate a reliable pattern on a VLSI semiconductor circuit chip by using a high throughput EB lithography.

The above objects can be attained by introducing a step of providing patterns which are delineated to join together with an overlap determined in accordance with the time interval between the respective delineations thereof by using an EB lithography employing a high current density and/or high energy electron beam. That is, when a first and a second patterns having respective edge portions to contact with each other are delineated in the order of the first pattern and the second pattern by respective exposures thereof to corresponding shots of an electron beam, at least one of the first and second patterns is extended in the direction perpendicular to the edge portions so that the patterns are provided with an overlap with the amount determined in accordance with the time interval between the respective shots of the electron beam to said edge portions.

There is a publication of a Japanese patent application, Tokukaisho No. 59-57428, disclosing overlappings of electron beam shots for delineating a pattern required to have a particularly high precision. That is, when a high precision pattern is delineated by using successive shots of a shaped electron beam, each of the shots is shifted so as to partially overlap the preceding shot. The disclosure asserts that the narrowing or broadening which would occurs between abutting shot patterns in a prior art EB lithography can be eliminated. However, the disclosure does not refer to the overlapping of the patterns to be joined together. Furthermore, the disclosure does not suggest any concepts of extending the patterns to be overlapped and of determining the amount of the extension based on the time interval between the respective formations of the patterns. Again, the present invention is not concerned with the overlapping between the shot patterns for constituting a pattern but with the overlapping between the patterns to be joined together. And further, in the present invention, the overlapping of the patterns is provided by extending at least one of the to-be-joined patterns and the extension of the patterns is determined according to the time interval between the respective formations of the to-be-joined patterns.

BRIEF DESCRIPTION OF DRAWINGS

FIG. 3 is a partial enlarged plan view of an interconnecting line composed of a plurality of rectangular patterns formed in a subfield on a semiconductor substrate chip;

DESCRIPTION OF PREFERRED EMBODIMENTS

Figure 1:
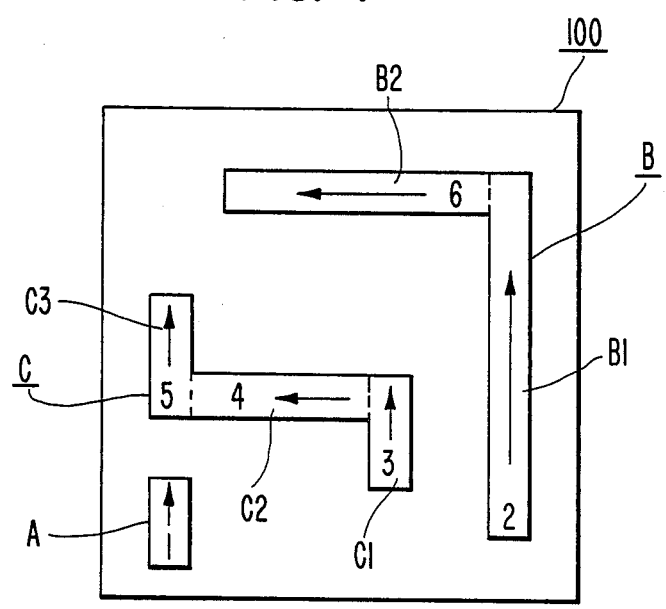
FIG. 1 is a schematic diagram illustrating patterns formed in a predefined area on a semiconductor chip.

For facilitating the understanding of the problem arised in an EB lithography employing a high current density and high energy electron beam such as used in a high throughput EB lithography, some of basic explanations will be described first in the following with reference to FIGS. 1 and 2. Referring to FIG. 1, patterns A, B and C are formed in a predefined area 100 referred to as a subfield. The subfield 100 is a unit area defined on a semiconductor substrate chip for assigning patterns t be delineated therein. For the simplicity's sake, only three patterns A, B and C are illustrated in the subfield.

The pattern B comprises component patterns B1 and B2, and pattern C does component patterns C1, C2 and C3. The pattern A can be assumed to comprise a single component pattern. Each of the component patterns A, B1, B2, C1, C2 and C3 is usually composed of a plurality of regions respectively corresponding to each of the shots of an electron beam. The regions are referred to as shot patterns or shot pattern regions, hereinafter. That is, the patterns A, B1, B2, C1, C2 and C3 are usually delineated by respective pluralities of EB shots applied thereto and transferred in the direction as indicated by arrows. Thus, each of the desired pattern A, B and C is completed. Generally, the electron beam is controlled to have a rectangular cross section with dimensions determined according to the conveniences of the subdivision of each component pattern.

The patterns A, B1, B2, C1, C2 and C3, are delineated in a predetermined order as indicated by the reference numerals respectively attached thereto, wherein the pattern having smaller Y-coordinate with respect to the left side bottom corner thereof is delineated earlier, for instance. Thus, as obviously shown in FIG. 1, the pattern A is formed first of all and the pattern B1 follows it. Subsequently, the patterns C1-C3 are successively formed and the pattern B2 follows them.

It should be noted that the patterns C1-C3 are formed successively with a respective short pause therebetween; e.g. there is a pause of about 0.5 microsecond (usec) between the final EB shot to the pattern C1 and the first shot to the pattern C2 and between the final shot to the pattern C2 and the first shot to the pattern C3, respectively. On the other hand, there is a relatively long pause or time interval between the respective delineations of the patterns B1 and B2. That is, the pattern B1 is formed prior to the pattern C1 and the pattern B2 is formed subsequently to the pattern C3. The time interval between the final EB shot to the pattern B1 and the first EB shot to the pattern B2 is roughly estimated by the duration of each EB shot and the number of EB shots used for delineating the patterns C1-C3. If the patterns C1-C3 are delineated by 20 shots as a whole, each shot having a duration of 0.8 usec, about 16 usec will elapse during the time interval. This is approximately 30 times larger than each of pauses involved in the delineation of the patterns C1-C3.

Figure 2B:
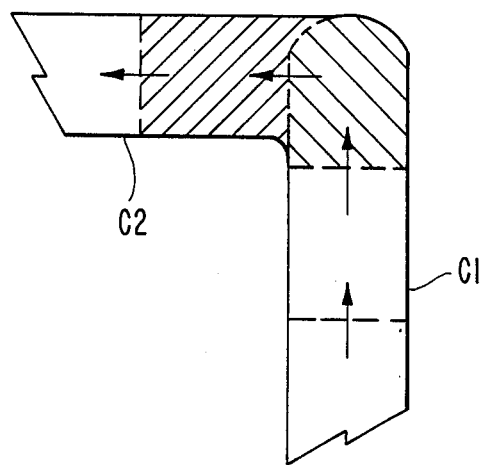
FIGS. 2A and 2B are schematic enlarged views each respectively illustrating an exemplary connecting portion of patterns formed to join together, these patterns being delineated by a high throughput EB lithography.
Figure 2A:
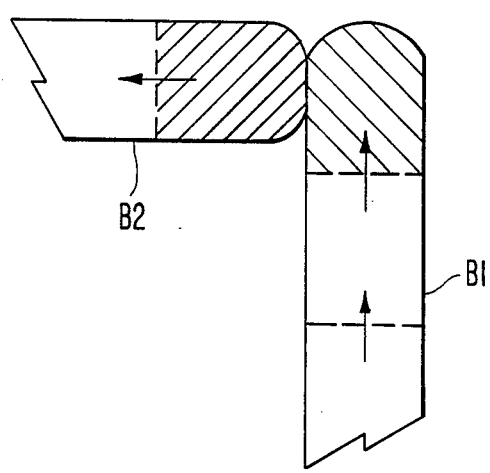

FIGS. 2A and 2B are schematic enlarged partial views, respectively illustrating the connecting portions of the patterns B1 and B2 and of the patterns C1 and C2, all of these patterns being delineated by a high throughput EB lithography. As shown in FIG. 2A, the patterns B1 and B2 is connected with each other by the contact between the final shot pattern region of the pattern B1 and the first shot pattern region of the pattern B2, each of which is indicated by hatching, wherein the connection B2 is achieved through an undesirably narrowed portion produced at the end of the pattern B2. On the other hand, as shown in FIG. 2B, the patterns C1 and C2 is formed to achieve an ideal contact condition therebetween through the final shot pattern region of the pattern C1 and the first shot pattern region of the pattern C2, as indicated by hatching. The arrows in FIGS. 2A and 2B indicate the transferring direction of EB shots successively applied to the corresponding shot pattern regions.

The undesirable connection between the patterns B1 and B2 is considered to be caused due to the above-mentioned long time interval between the formations of the patterns. That is, if the time interval is so small as that between the patterns C1 and C2, the connection is achieved as desired. On the contrary, a long time interval such as that between the patterns B1 and B2 results in the undesirable connection. The reason why the connecting condition of patterns to be joined together depends on the time interval between the respective formations thereof is attributed to the nonuniform temperature rise caused in the shot pattern region by the EB shot, and also to the temperature-dependent sensitivity of the resist material layer applied to the region. The nonuniform temperature rise is enhanced by the application of a high current density and high energy of the electron beam as employed in the high throughput EB lithography.

As mentioned before, a high throughput EB lithography uses an electron beam with a current density 10 times or more larger than that used in the conventional EB lithography. As a result, a steeper and larger temperature rise is caused in each of the regions corresponding to the EB shots, compared with that caused in the conventional EB lithography. The temperature rise is greater in the center than in the periphery of each shot pattern region, and thus, the nonuniformity in the temperature distribution in the shot pattern region is magnified.

On the other hand, currently used EB sensitive resist materials, typically including PMMA (poly-methyl metacrylate), PDAP (poly-diallyl orthophthalate) and CMS (chloro-methyl polystyrene) reveal a sensitivity characteristic dependent of the temperature thereof, where the sensitivity increases as the temperature rises.

The sensitivity is generally defined by the reciprocal of charges (electrons) incident on a unit area of the resist material layer, e.g. coulombs/cm$^2$, hence, being relative to the reciprocal of the product of the current density (A/cm$^2$) and the time of duration in seconds of the shot of the electron beam. Therefore, because of the temperature rise caused in each shot pattern region by the high current density and high energy EB shot, the sensitivity of the resist material layer becomes greater at the center than at the periphery of the region, and thus, a nonuniform sensitivity distribution is produced in the resist material layer in each shot pattern region.

In a high throughput EB lithography, the current density or shot duration of the electron beam must be provided with a correction in association with the sensitivity increase in the resist material layer due to the temperature rise, because the current density excessively larger than that required for the resist material which is increased in the sensitivity thereof undesirably broaden the width of a pattern formed in the resist material layer, thereby decreasing the pattern accuracy. Generally, the nonuniform sensitivity produced in a resist material layer in accordance with the nonuniform temperature rise distributes along a round equi-sensitivity contour line. Accordingly, the shot pattern deviates from the shape of the corresponding EB shot usually being shaped in a rectangle, hence, resulting in a round shot pattern. This round shot pattern would cause a poor contact between patterns to be joined together.

However, if EB shots are successively applied to every two shot pattern regions arranged to abut each other in a row, the heat generated in one of the two shot pattern regions, which is subjected to a preceding EB shot, diffuses around. Hence, the temperature at another of the two shot pattern regions, which is to be subjected to a subsequent EB shot, is raised by the diffused heat. Such temperature rise occurs stronger in the vicinity of the trailing edge of the subsequent shot pattern region than at the center thereof, thereby reducing the nonuniformity in the temperature distribution in the subsequent shot pattern region during the EB shot applied thereto.

Hence, the current density or shot duration of the electron beam is controlled so that a pattern delineated by the successive shots thereof can obtain a predetermined width. This means that the connection between patterns which are joined together through the respective shot pattern regions thereof, which are successively delineated by corresponding EB shots, can be achieved in a desirable condition. That is, if the pause or time interval between the EB shots to the respective regions of patterns to be joined together through the regions is as short as that between the pattern C1 and C2, there occurs no significant problem in the connection of patterns joined together, as described with reference to FIG. 2B.

It is easely imagined from the above discussion that the influence of the nonuniform sensitivity distribution which would provide a round shaped shot pattern is revealed at the ends of a pattern, corresponding to the first and final EB shots applied thereto, even when the pattern is delineated by successive EB shots. However, when there is only little pause between the respective shot pattern regions of patterns which are connected through the shot pattern regions, the connection between the patterns is substantially free from the influence as shown in FIG. 2B. On the contrary, if the time interval between the EB shots to the respective shot pattern regions relevant to the connection between patterns becomes longer, the influence of the nonuniform sensitivity distribution is strong such that a poor connection as shown in FIG. 2A is produced between the patterns.

In a high throughput EB lithography in accordance with the present invention, at least one of the patterns to be joined together is extended so as to partially overlap the counterpart pattern, thereby providing a desired connection condition therebetween. That is, in order to produce a desirably connected patterns in a resist material layer after the development process, conditions of the exposure of a resist material layer to the shots of an electron beam are controlled according to the time interval between the respective formations of the to-be-joined patterns. The time interval is derived from the pattern data including the order of the exposures of the patterns to an electron beam and the respective dimensions of the patterns which are arranged between the to-be-joined patterns in the queue of the order of EB exposure. The amount of the overlapping or extension of the to-be-joined patterns is determined based on the time interval.

The narrowing in the width of a shot pattern region becomes more noticeable with the respective increases in the current density, acceleration energy and the shot size of the electron beam. Further, the width is different depending on the thermal conductivity characteristic of the substrate and the underlying layer between the resist material layer and the substrate. Therefore, these parameter must be taken into account upon determining the amount of the overlapping of patterns based on the time interval. Practically, an optimal amount of overlap or extension is experimentally determined for several time interval values at each of the various combinations of the above-mentioned parameters. Some of exemplary values of the extension follow, which were recognized as necessary for forming patterns to be joined together in the resist material layers composed of a PMMA having sensitivity of $3 \times 10^{-5}$ coulombs/cm$^2$ and applied to different substrates with the various thicknesses thereof. Each shot of the electron beam employed had a current density of 40A/cm$^2$, acceleration energy of 20KeV and a shot size of 3 micron (um) square, and was applied to the resist material layers for a 0.75 usec duration.

| Time Interval (usec) | Extension (um) |
| --- | --- |
| (1) PMMA Layer Thickness: 1 um, Substrate: SiO$_2$/Si | |
| 1-2 | 0.05 |
| 2-6 | 0.1 |
| 6-9 | 0.15 |
| >9 | 0.2 |
| (2) PMMA Layer Thickness: 2 um, Substrate: SiO$_2$/Si | |
| 3-7 | 0.05 |
| 7-15 | 0.1 |
| 15-23 | 0.15 |
| >23 | 0.2 |
| (3) PMMA Layer Thickness: 1 um, Substrate: Si Only | |
| 2-4 | 0.1 |
| 4-6 | 0.15 |
| >6 | 0.2 |

Since it is difficult to directly measure the temperature at the shot pattern region, the temperature rise in the region due to the EB shot was estimated by a simulation based on the respective thicknesses and thermal conductivity characteristics of the resist material layer and the substrate. As a result, a rise of 200°-300° C. was revealed to be caused in a PMMA resist material layer having sensitivity $5 \times 10^{-5}$ coulombs/cm$^2$ and formed on a Si wafer substrate by the shot of an electron beam having a shot size of 3 um square, current of 4.5uA (corresponding to a current density of 50A/cm$^2$) and acceleration energy of 20KeV. The duration of the EB shot was controlled at 1 usec corresponding to the sensitivity of the PMMA resist material.

FIG. 3 is a partial plan view of the patterns of interconnecting lines formed in a subfield on a semiconductor substrate chip. One of the interconnecting lines has a meandering structure comprising a number of long rectangular component patterns 1, 2, 3, 999 and 1000, which are serially connected to each other along the respective longitudinal directions thereof. Another of the lines is composed of a long rectangular component pattern 10 which is perpendicularly connected to a component pattern 2 of the meandering interconnecting line. The reference numerals also indicate the order of the delineations of the patterns by using a high throughput EB lithography in accordance with the present invention.

Referring to FIG. 3, the patterns 1, 2 and 3 are successively delineated by the respective EB shots, wherein only short pause as mentioned above are involved therebetween, therefore, no overlap is provided between the patterns abutting each other. However, a rather longer pause occurs between the delineations of the patterns 2 and 10, approximately corresponding to the difference between the EB shot order numbers thereof. Accordingly, an overlap is provided between the patterns 2 and 10 by providing the pattern 10 with an extension d1. Further, the pattern 1000 which is to be connected to the pattern 1 is delineated with a long pause or time interval after the pattern 1 was delineated. Therefore, the temperature in the vicinity of the pattern 1, which was once raised up to a few 100s° C. as estimated in the above, has returned to around room temperature and there could be anticipated an insufficient connection between the patterns 1 and 1000. Accordingly, the pattern 1000 is provided with a maximum extension d2 (approximately 0.2 um, for example, as described above) for overlapping with the patterns 1. Such extension can be shared by both of the patterns to overlap each other. For example, if an extension of 0.2 um is needed, each of the patterns 1 and 1000 is provided with an extension of 0.1 um.

Figure 4:
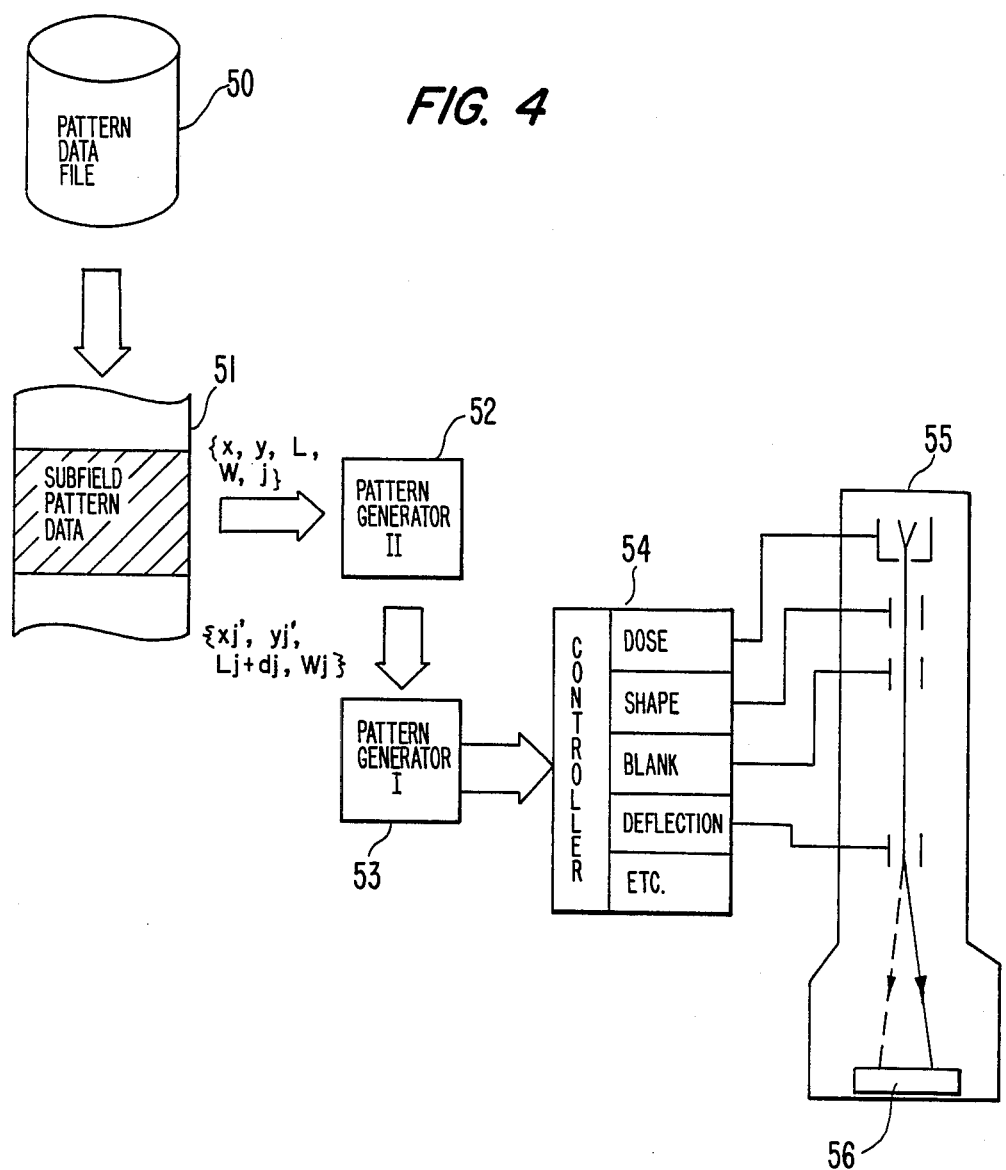
FIG. 4 is a block diagram of an EB exposure system used for delineating patterns in accordance with the present invention.

FIG. 4 is a block diagram of an EB exposure system used for conducting the EB lithography according to the present invention. Referring to FIG. 4, data relevant to the whole patterns to be produced on a semiconductor chip area are read from the pattern data file 50 and developed on a random access memory 51. The pattern data for each of patterns to be assigned at the respective predetermined positions in the subfield include X- and Y-coordinates, x and y, defined with respect to a predetermined corner of the pattern, length "L" and width "W", and EB exposure order "j" of the pattern. As a novel feature in accordance with the present invention, a pattern generator II (52) is incorporated in the system. The pattern generator II examines all of the respective pattern data relevant to the patterns to be delineated in the subfield area and distinguishes the to-be-joined patterns from others. Further, the pattern generator II calculates each time interval which will be involved between the respective delineations of corresponding to-be-joined patterns and provides the length "L" of at least one of the corresponding to-be-joined patterns with a correction "d" corresponding to the time interval. The value for the correction is experimentally determined as described before.

A pattern generator I (53), which is equivalent to that in a conventional EB exposure system, receives pattern data of the patterns from the pattern generator II one by one in response to the respective delineation of the corresponding patterns. Each pattern data includes X- and Y-coordinates, $x_j'$ and $y_j'$, length $L_j + d_j$ and width $W_j$, where the coordinates $x_j'$ and $y_j'$ represent revised coordinates, wherein either of the X- or Y-coordinate is provided with a correction the same as the extension "d", if the extension of a pattern occurs beyond the X- or Y-coordinate. The pattern generator I processes the pattern data sent from the pattern generator II and sends a controller 54 control signals generated according to the processed pattern data. Hence, the EB exposure column 55 operates to provide the semiconductor chip 56 with the shots of an electron beam, whose dosage of currents, shape and size, blanking time and deflecting direction and angle are controlled by the signals.

Figure 5A:
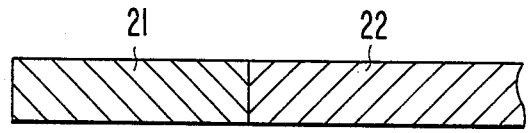
FIGS. 5A–5F are schematic diagrams illustrating various modes of overlapping of patterns to be joined together.
Figure 5B:
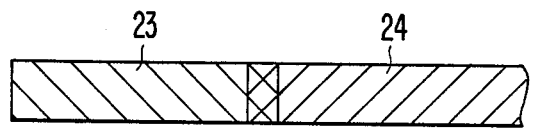
Figure 5C:
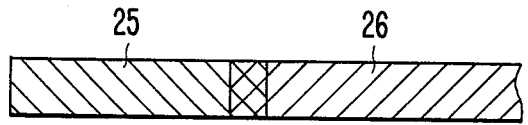
Figure 5D:
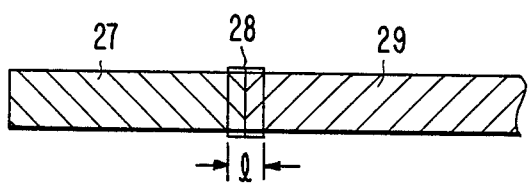

FIGS. 5A–5F are schematic diagrams illustrating various modes of connections between patterns to be joined together. FIG. 5A shows connected patterns 21 and 22 which are connected with each other through respective shot patterns formed by respective EB shots with a short pause therebetween. Therefore, none of overlapping is needed between the patterns. FIG. 5B shows patterns 23 and 24, wherein the pattern 23 is provided with an extension so as to overlap the pattern 24. Generally, it is desirable to provide such extension for a pattern having a shorter length, in order to minimize the influence involved in connection with the extension. FIG. 5C shows patterns 25 and 26 both of which are extended to overlap each other, wherein the amount of each extension is selected approximately one half of that needed according to the corresponding time interval. FIG. 5D shows patterns 27, 28 and 29, wherein the pattern 28 additionally formed to overlap the patterns 27 and 29 and any of the patterns 27 and 29 is not provided with an extension. Such kind of patterns as the pattern 28, each being different in length "l" thereof, are registed in the pattern data file in advance. One of such patterns, having a length "l" equivalent to the extension determined according to the time interval, is selected and placed so as to overlap both of the patterns 27 and 29. Thus, the pattern 28 can be treated as an independent pattern like the patterns 27 and 29. That is, the pattern 28 is to be connected with the pattern 27 and the pattern 29 is connected with the pattern 28. In this case the respective overlappings of the patterns 27 and 28 and of the patterns 28 and 29 are determined according to the corresponding time intervals therebetween.

Figure 5E:
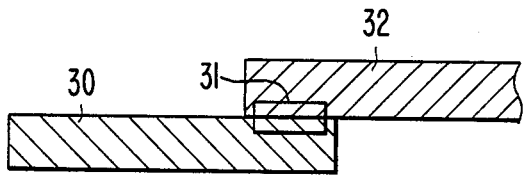
Figure 5F:
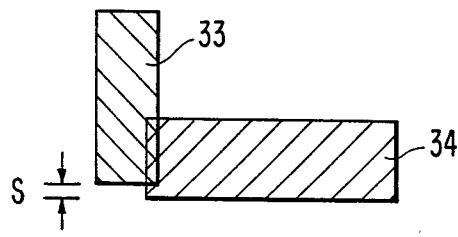

FIG. 5E shows patterns 30, 31 and 32, wherein the patterns 30 and 32 are connected through the respective portions on the longitudinal edges thereof. In this case, the additional pattern 31 is inevitably used for eliminating the requirement of extensions in the width directions of the patterns. Such extensions would result in the broadening of the patterns 30 and 32. FIG. 5F shows patterns 33 and 34, wherein the amount of the shift "s" between the patterns is small, therefore, the overlapping of the patterns is attained by extending the pattern 34 toward the pattern 33 without incorporating any additional pattern as used in FIG. 5E.

The resist material layer in the above embodiments may be formed on a substrate composed of a material selected from semiconductors including silicon and compoun semiconductors such as GaAs and InP, and from insulating materials including quartz. Further, there may be formed a single or multiple layers of insulating materials and/or metals or metal alloys between the resist material layer and the substrate. The multiple layers may have an alternating laminated structure of layers each composed of one of the insulating materials and the metals or metal alloys, as the layered structures usually employed in ordinary VLSI semiconductor circuit devices. Some of exemplary multiple layer structures include $Al/Si_3N_4/SiO_2$ on a Si substrate and $Cr_2O_3/Cr$ on a quartz plate. These structures are popular in VLSI circuit devices and in the photo-masks fabricated by using an electron beam lithography, respectively. Moreover, the present invention is applicable to the fabrication of photo-masks for an X-ray exposure, wherein patterns are delineated in a resist material layer formed on a metal layer such as chromium film which is formed on an X-ray transmissible substrate such as a boron nitride thin film. The boron nitride film is supported by a flange or frame provided therearound.

Although the present invention has been described in its preferred form of embodiments in connection with the fabrication of a VLSI semiconductor circuit, it is to be understood that the method thereof can be applied to a workpiece other than a semiconductor substrate, on which fine and precision patterns are delineated by the shots of an shaped electron beam. It is also to be understood that further modifications will occur to those skilled in the art without departing from the spirit of the invention, and that the scope of the present invention is therefore to be determined solely by the appended claims.

We claim:

1. A method of electron beam lithographic exposure for forming a plurality of patterns including first and second patterns, said first and said second patterns being delineated in the order of said first pattern and said second pattern by respective exposures thereof corresponding to at least single shots of an electron beam, said first and said second patterns having respective edge portions contacting each other, wherein said method comprises a step of:

extending at least one of said first and said second patterns in the direction perpendicular to said edge portions so that said first and said second patterns are provided with a predetermined overlap dependent on the time interval between the respective shots of the electron beam to said edge portions.

2. The method of claim 1, wherein any one of said first and said second patterns is rectangular.

3. The method of claim 1, wherein both of said first and said second patterns are formed in a layer of an electron beam sensitive resist material which becomes more sensitive when the temperature thereof is raised.

4. The method of claim 3, wherein said resist material layer is formed on a semiconductor substrate.

5. The method of claim 3, wherein the resist material is selected from a polymethyl methacrylate.

6. The method of claim 3, wherein the resist material is a poly-di-allyl-orthophthalate.

7. The method of claim 3, wherein the resist material is a chloromethyl polystyrene.

8. The method of claim 4, wherein there is formed at least one insulating material layer between the resist layer and the semiconductor substrate.

9. The method of claim 3, wherein the electron beam has an energy between 20KeV and 80KeV with a current flux in the range from 1 to 20 microamperes.

10. The method of claim 9, wherein the thickness of the resist layer is larger than 0.1 micron.

11. The method of claim 1, wherein said overlap is produced by extending both of said first and said second patterns wherein the respective extensions of said first and said second patterns are equal to approximately one half of the amount of said overlap.

12. The method of claim 3, wherein said resist material layer is formed on a metal or metal alloy layer which is supported by said substrate.

13. The method of claim 12, further comprising forming at least one insulating material layer between the resist layer and the metal or metal alloy layer.

* * * * *